(12) United States Patent
Kim et al.

(10) Patent No.: US 10,290,525 B2
(45) Date of Patent: May 14, 2019

(54) MARKING METHOD FOR WAFER DICE

(71) Applicant: EO TECHNICS CO., LTD., Anyang-si, Gyeonggi-do (KR)

(72) Inventors: Sun Jung Kim, Gunpo-si (KR); Jae Man Choi, Uiwang-si (KR); Sung Beom Jung, Gwangmyeong-si (KR); Jung Jin Seo, Anyang-si (KR)

(73) Assignee: EO TECHNICS CO., LTD., Gyeonggi-do (KR)

( * ) Notice: Subject to any disclaimer, the term of this patent is extended or adjusted under 35 U.S.C. 154(b) by 386 days.

(21) Appl. No.: 15/321,938

(22) PCT Filed: Jul. 1, 2014

(86) PCT No.: PCT/KR2014/005871
§ 371 (c)(1),
(2) Date: Dec. 23, 2016

(87) PCT Pub. No.: WO2015/199269
PCT Pub. Date: Dec. 30, 2015

(65) Prior Publication Data
US 2017/0162410 A1    Jun. 8, 2017

(30) Foreign Application Priority Data

Jun. 26, 2014 (KR) .................. 10-2014-0079116

(51) Int. Cl.
*B23K 26/00* (2014.01)
*H01L 21/00* (2006.01)
(Continued)

(52) U.S. Cl.
CPC .... *H01L 21/67282* (2013.01); *B23K 26/0006* (2013.01); *B23K 26/032* (2013.01);
(Continued)

(58) Field of Classification Search
USPC .............. 219/121.6–121.83; 438/460–463; 257/618–620, 675, E21.001
See application file for complete search history.

(56) References Cited

U.S. PATENT DOCUMENTS 5,910,846 A * 6/1999 Sandhu ................ B24B 37/013
257/E21.528
7,315,361 B2   1/2008 Schramm et al.
(Continued)

FOREIGN PATENT DOCUMENTS

CN    101419177 A    4/2009
JP    2004-111955 A   4/2004
(Continued)

OTHER PUBLICATIONS

English translation of the International Search Report and the Written Opinion of the International Searching Authority (Forms PCT/ISA/210 and PCT/ISA/237) dated Feb. 27, 2015, by the Korean Intellectual Property Office in corresponding International Application No. PCT/KR2014/005871. (12 pages).
(Continued)

*Primary Examiner* — Sang Y Paik
(74) *Attorney, Agent, or Firm* — Buchanan Ingersoll & Rooney PC

(57) ABSTRACT

Disclosed is a method for marking, by using a laser marker, a plurality of wafer dice divided by a wafer dicing process. The disclosed marking method for wafer dice comprises the steps of: setting a plurality of scan regions having a mutually overlapping portion on a wafer including the wafer dice; scanning the scan regions of the wafer a plurality of times by using a line scan camera; collecting position information of each of wafer dice located in regions in which the scan regions do not overlap; collecting, through image synthesis, position information of each of wafer dice located in regions in which the scan regions overlap; and marking, by using the
(Continued)

laser marker, each of all the wafer dice of which the position information has been collected.

11 Claims, 6 Drawing Sheets

(51) Int. Cl.
| | |
|---|---|
| *H01L 21/67* | (2006.01) |
| *H01L 23/544* | (2006.01) |
| *B23K 26/03* | (2006.01) |
| *H01L 21/268* | (2006.01) |
| *H01L 21/78* | (2006.01) |
| *B23K 26/08* | (2014.01) |
| *B23K 26/359* | (2014.01) |
| *B23K 101/40* | (2006.01) |
| *B23K 103/00* | (2006.01) |

(52) U.S. Cl.
CPC ........ *B23K 26/0869* (2013.01); *B23K 26/359* (2015.10); *H01L 21/268* (2013.01); *H01L 21/78* (2013.01); *H01L 23/544* (2013.01); *B23K 2101/40* (2018.08); *B23K 2103/56* (2018.08); *H01L 2223/5446* (2013.01); *H01L 2223/54433* (2013.01); *H01L 2924/0002* (2013.01)

(56) References Cited

U.S. PATENT DOCUMENTS

| | | | | |
|---|---|---|---|---|
| 2002/0093648 | A1* | 7/2002 | Nikoonahad | ........ G01N 21/211 356/237.1 |
| 2009/0314751 | A1* | 12/2009 | Manens | .......... H01L 31/022425 219/121.69 |
| 2010/0127355 | A1* | 5/2010 | Mariani | .................. H01L 21/78 257/620 |

FOREIGN PATENT DOCUMENTS

| | | |
|---|---|---|
| JP | 2004-193171 A | 7/2004 |
| JP | 2009-016455 A | 1/2009 |
| JP | 2012-222054 A | 11/2012 |
| KR | 10-1998-0076498 B1 | 11/1998 |
| KR | 10-2008-0000681 A | 1/2008 |
| KR | 10-2009-0012977 A | 2/2009 |

OTHER PUBLICATIONS

International Preliminary Report on Patentability (Form PCT/IB/373) dated Dec. 27, 2016, by the International Bureau of WIPO in corresponding International Application No. PCT/KR2014/005871. (1 page).

Office Action dated Jul. 2, 2018, by the State Intellectual Property Office of China in corresponding Chinese Patent Application No. 201480079462.5. (5 pages).

* cited by examiner

MARKING METHOD FOR WAFER DICE

TECHNICAL FIELD

The present invention relates to a marking method of wafer dies, and more particularly, to a method of marking wafer dies with a laser in which wafer dies which are divided after a wafer dicing process are marked with a laser after the position information is confirmed by using a line scan camera.

BACKGROUND ART

According to conventional technologies, the following method has been used as a laser marking method of wafer dies. First, the back surface of a wafer in which wafer dies are integrated is made to have a desired thickness through backgrinding, and then, two wafer dies are selected as first and second reference wafer dies among wafer dies on the front surface of the wafer. By using the thus-selected first and second reference wafer dies, positions of all the rest wafer dies are identified and then, by using thus-identified position information, each wafer die is marked with a laser. Then, by dicing the wafer, the marked wafer dies are divided. However in this method, in the wafer dicing process fragments or chippings may be generated from the back surface of the wafer or the wafer may be damaged.

There is a dicing before grinding (DBG) process as a method to solve this problem. In the DBG process, a wafer in which wafer dies are integrated is half-cut before grinding, and then backgrinding is performed to divide wafer dies. Then, a marking process for the thus-divided wafer dies is performed with a laser. However, as the divided wafer dies are located askew from the original positions on the wafer, it is difficult to mark the wafer dies on an accurate position of each of the divided wafer dies with the conventional marking method using the two wafer dies, namely, the first and second reference wafer dies, for marking the rest wafer dies.

Meanwhile, a method of identifying position information of wafer dies by using a vision camera has been used according to conventional technologies. However, in this method, the vision camera photographs each wafer die individually to measure the position, and therefore the vision camera should perform the measuring job the same number of times as the number of the wafer dies. For example, if 1000 wafer dies are on a wafer, the vision camera should be used 1000 times to identify the position information of all wafer dies. Accordingly, it takes a long time.

DETAILED DESCRIPTION OF THE INVENTION

Technical Problem

Provided is a method in which the position information of wafer dies which are divided in a dicing process is accurately measured and laser marking is performed by using a line scan camera.

Advantageous Effects of the Invention

According to embodiments of the present invention, the shape and position information of wafer dies which are divided in a dicing process and arranged irregularly can be quickly collected by using a line scan camera. If a laser marking job is performed based on the thus-collected shape and position information of the wafer dies, marking can be accurately performed on a required location of each of the divided wafer dies.

BEST MODE

Figure 1:
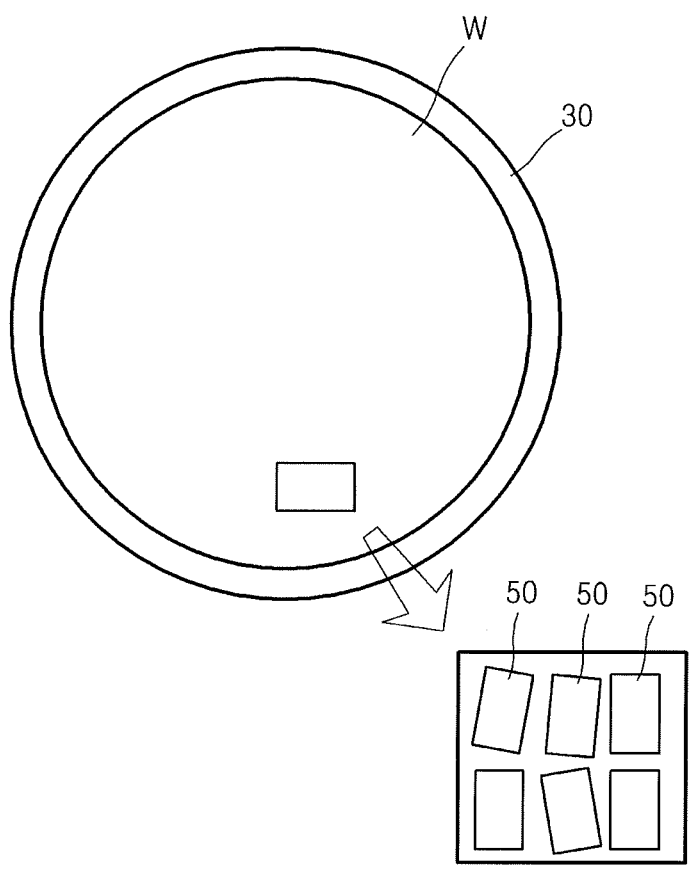
FIG. 1 shows wafer dies arranged irregularly after a wafer is divided in a dicing process.

Reference will now be made in detail to embodiments, examples of which are illustrated in the accompanying drawings. In the drawings, like reference numerals refer to like elements throughout, and sizes or thicknesses of elements may be exaggerated for clarity of explanation.

FIG. 1 shows a state in which a wafer W is divided in a dicing process.

Referring to FIG. 1, if the wafer W attached on a fixing tape 30 is divided though the dicing process, at least some of a plurality of divided wafer dies 50 are made askew such that the plurality of divided wafer dies are irregularly arranged on the fixing tape 30.

The wafer dies 50 arranged irregularly as shown in FIG. 1 are generated through a following process. First, the wafer W on which the wafer dies 50 are integrated before the dividing is half cut, and then, a surface protection film (not shown) is coated on the wafer W to cover the wafer dies 50. Then, backgrinding of the back surface of the wafer W is performed up to a cutting point such that the wafer W is divided into a plurality of wafer dies 50. Here, the divided wafer dies 50 are irregularly arranged on the surface protection film as the positions of the divided wafer dies 50 are changed by the dicing process.

Next, the fixing tape 30 for fixing the divided wafer dies 50 is attached on the back surface of the wafer 3, and then the surface protection film is removed. Thus, when the wafer W is cut before a marking process is performed, the divided wafer dies are irregularly arranged. Accordingly, in order to perform laser marking accurately on a required location of each of the divided wafer dies 50, the position information of the divided wafer dies 50 should be accurately collected in order to perform marking.

Figure 2:
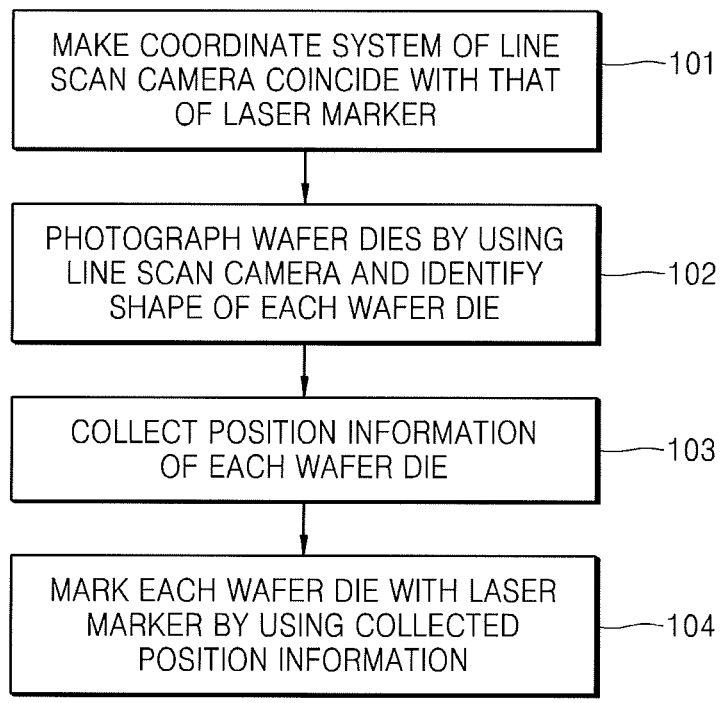
FIG. 2 is a flowchart of a marking method of wafer dies according to an embodiment of the present invention.

FIG. 2 is a flowchart of a marking method of divided wafer dies according to an embodiment of the present invention.

Figure 3:
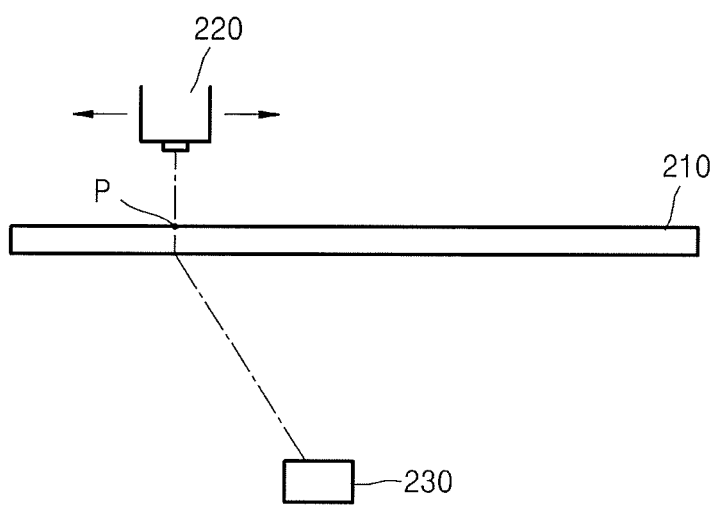
FIG. 3 illustrates a method of making the coordinate system of a line scan camera coincide with the coordinate system of a laser marker.

Referring to FIG. 2, firstly, a line scan camera 220 of FIG. 3 and a laser marker 230 of FIG. 3 are prepared, and then, the coordinate system in the line scan camera 220 and the coordinate system in the laser marker 230 are set to coincide with each other in operation 101. As will be described below, the line scan camera 220 collects position information of each of the divided wafer dies 50, and the thus-collected position information is input into the laser marker 230 to perform a marking process. As a prerequisite for this, it is necessary to make the coordinate system of the line scan camera 220 coincide with the coordinate system of the laser marker 230.

FIG. 3 illustrates a method of making the coordinate system of a line scan camera 220 coincide with the coordinate system of a laser marker 230. Referring to FIG. 3, a transparent plate 210 with a shape corresponding to the wafer W is prepared and then, the line scan camera 220 is positioned above the transparent plate 210 and the laser marker 230 is positioned below the transparent plate 220. Next, if the laser marker emits a beam on a predetermined position (for example, P1) on the transparent plate, the line scan camera 220 recognizes the position P1 on which the beam is emitted. In this process, the coordinate systems of the line scanner 220 and the laser marker 230 are made to coincide with each other.

After the coordinate systems of the line scanner 220 and the laser marker 230 are made to coincide with each other, the shape and position information of each of the divided wafer dies 50 is obtained by using the line scan camera 220 in operation 102. Here, the shape and position information of all the wafer dies irregularly arranged can be collected by the line scan camera 220 performing the scan process multiple times as will be described below.

Then, the position information of the wafer dies 50 obtained through the line scan camera 220 is input to the laser marker 230 provided below the wafer W. According to the thus-input position information, the laser marker 230 performs a laser marking job on each of the divided wafer dies 230. Here, according to the position information of the wafer dies 50 obtained through the line scan camera 220, the laser marker 230 can accurately perform marking on a desired location of each of the wafer dies 50.

A process of obtaining shape and position information of each of the wafer dies 50 by using the line scan camera 220 will now be explained in detail.

Figure 4A:
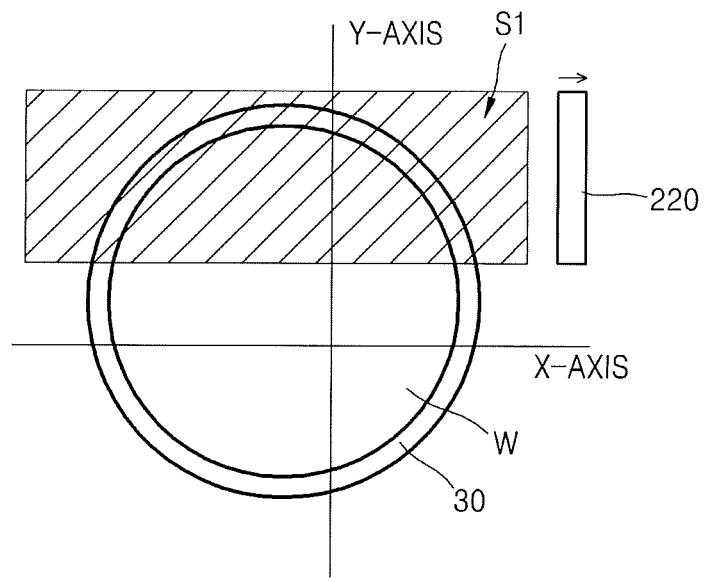
FIGS. 4A through 4C show a line scan camera scanning multiple times wafer dies on a wafer according to an embodiment of the present invention.
Figure 4B:
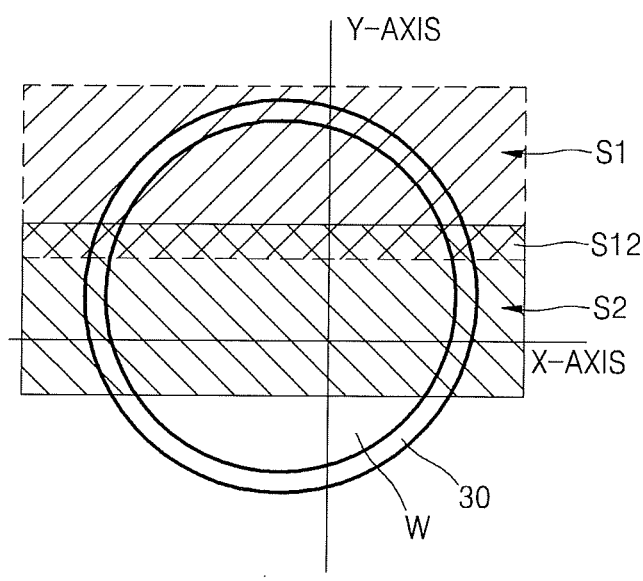
Figure 4C:
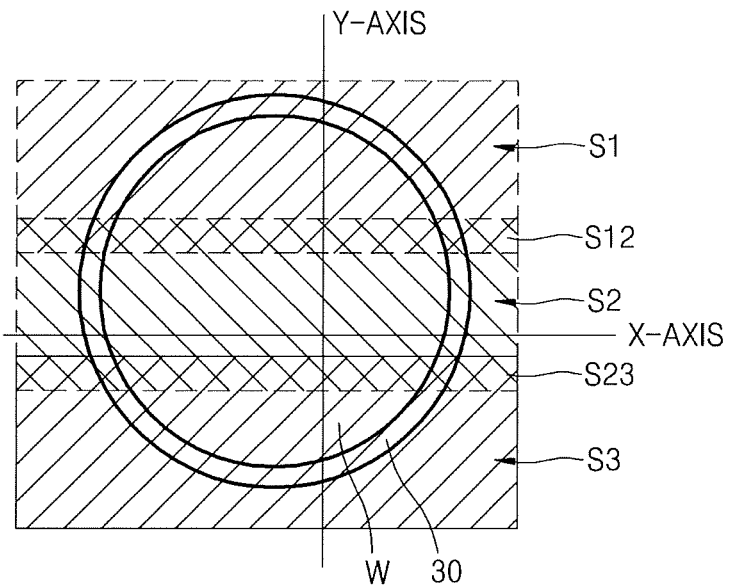

FIGS. 4A through 4C show a process of a line scan camera scanning multiple times on a wafer W including wafer dies divided and arranged irregularly. FIGS. 4A through 4C illustrates the line scan camera 220 scanning three times as an example. For example, when the diameter of the wafer W is 300 mm, if a line scan camera 200 with a 120 mm scan field is used, the whole wafer can be scanned by performing the scan process approximately 3 times.

First, a plurality of scan areas, that is, first, second and third scan areas S1 through S3, are set on the wafer W including the wafer dies which are divided and arranged irregularly. Here, parts of the first through third scan areas S1 through S3 may overlap each other. Referring to FIG. 4A, as the line scan camera 220 moves in a predetermined direction, the first scan area S1 is scanned. The first scan area S1 may include a first part of the wafer W (for example, the top part of the wafer W).

Then, referring to FIG. 4B, a second scan area S2 is scanned with the line scan camera 220 moving in a predetermined direction. The second scan area S2 may include a second part of the wafer W (for example, the middle part of the wafer W). Here, as a part of the second part of the wafer W overlaps the first part of the wafer W, a first overlapping area S12 in which the first and second scan areas S1 and S2 overlap each other may be formed between the first and second scan areas S1 and S2.

Then, referring to FIG. 4C, a third scan area S3 is scanned by moving the line scan camera 220 in a predetermined direction. The third scan area S3 may include a third part of the wafer W (for example, the bottom part of the wafer W). Here, as a part of the third part of the wafer W overlaps the second part of the wafer W, a second overlapping area S23 in which the second and third scan areas S2 and S3 overlap each other may be formed between the second and third scan areas S2 and S3.

In the present embodiment, the line scan camera 220 performs the scan process on the wafer W multiple times and through this scan process, the shape and position information of the wafer dies arranged irregularly on the wafer W is obtained. Accordingly, the shape and position information of all wafer ties which are divided in the dicing process and arranged irregularly can be quickly collected using the line scan camera 220.

Figure 5:
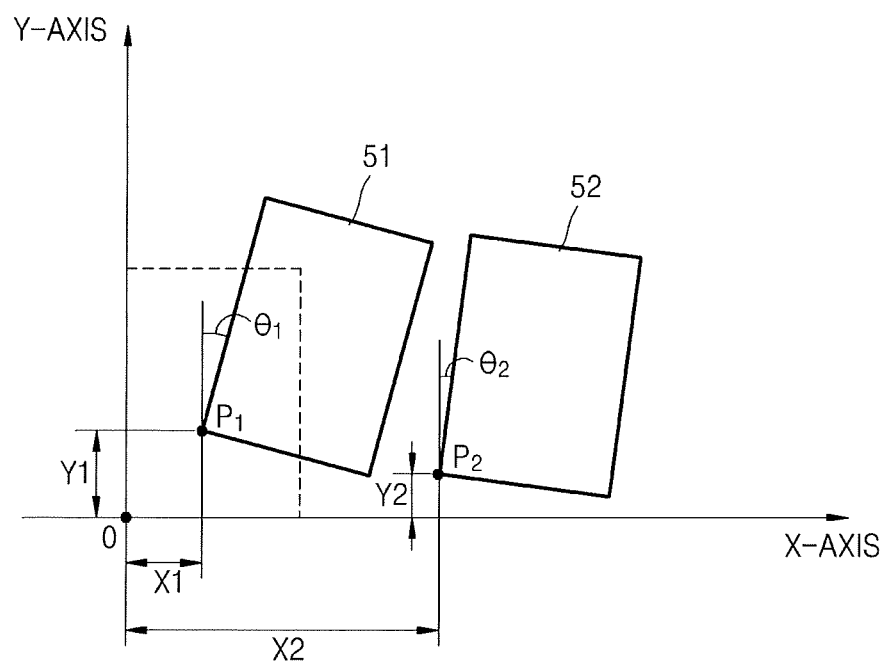
FIG. 5 illustrates a method of collecting shape and position information of wafer dies in a scan area in which scan areas do not overlap.
Figure 6A:
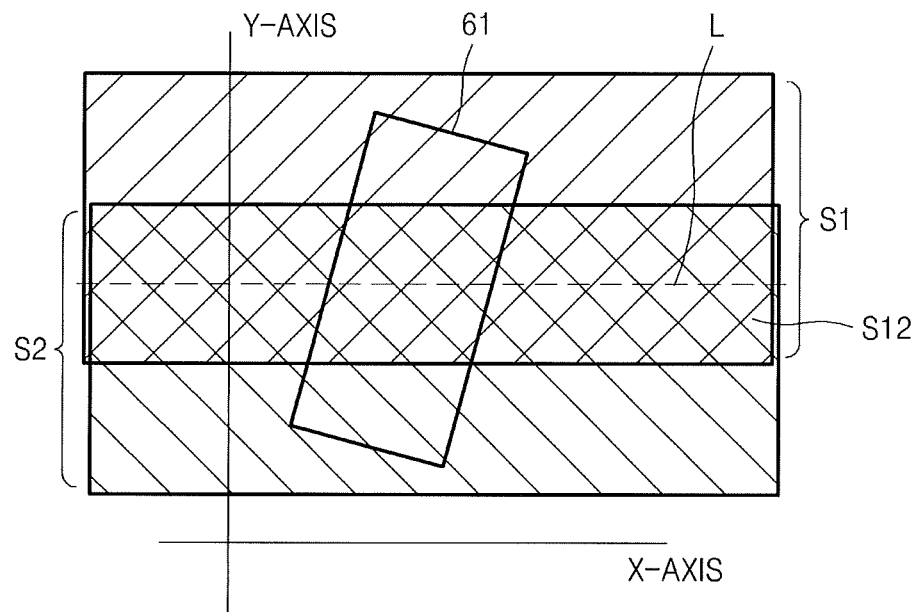
FIGS. 6A through 6D illustrate a method of collecting shape information of wafer dies in a scan area in which scan areas overlap.

The process of obtaining shape and position information of all wafer dies according to the present embodiment includes, through the multiple scanning process describe above, a process of obtaining position information of the wafer dies 51 and 52 of FIG. 5 which are in scan areas which do not overlap each other, in the first through scan areas S1 through S3, and a process of obtaining the shape and position information of the wafer dies 61 of FIG. 6A which are in the first and second overlapping areas S12 and S23.

First, FIG. 5 illustrates a method of collecting shape and position information of wafer dies 51 and 52 in a scan area which does not overlap other scan areas. In FIG. 5, the outlines of two wafer dies, first and second wafer dies 51 and 52, which are arranged irregularly and reference points P1 and P2 are shown on an X-Y coordinate system. Referring to FIG. 5, as the line scan camera 220 moves and scans the wafer dies 50, the shape of each of the wafer dies 50 is identified. In this process, the line scan camera 220 photographs each of the wafer dies 50 and then, through thus-captured images, the outline of each of the wafer dies 50 is expressed. Then, one of the vertices of each of the wafer dies 50 is selected as a reference point (for example, P1 and P2 of FIG. 5).

After the shape of each wafer die 50 is identified in this way, position information of each of the wafer dies 50 is collected in operation 103.

The position information of each of the divided wafer dies 50 can be collected by measuring the position of the reference point and tilt angle of each of the wafer dies 50.

In detail, the position information of a first wafer die 51 in FIG. 5 may be the position of the reference point P1 and tilt angle ($\theta_1$) of the first wafer die 51.

The position of the reference point P1 of the first wafer die 51 may be obtained by measuring the coordinate values (X1, Y1) of the reference value P1 in the X-Y coordinate system, and the tilt angle ($\theta_1$) of the first wafer die 51 may be obtained from the external shape of the first wafer die 51 by measuring the angle of the first wafer die 51 leaning relative to the X-axis or Y-axis.

The position of the reference point P2 of the second wafer die 52 may be obtained by measuring the coordinate values (X2, Y2) of the reference value P2 in the X-Y coordinate system, and the tilt angle ($\theta_2$) of the second wafer die 52 may be obtained from the external shape of the second wafer die 52 by measuring the angle of the second wafer die 52 leaning relative to the X-axis or Y-axis. If the line scan camera 220 thus scans the wafer dies 51 and 52 located in scan areas which do not overlap other scan areas, the position information of the wafer dies 51 and 52 (that is, the position of the reference point and tilt angle of each wafer die 51 and 52) can be obtained.

Next, FIGS. 6A through 6D illustrate a method of collecting shape information of wafer dies 61 in an overlapping scan area S12.

FIG. 6A illustrates a wafer die 61 located in the first overlapping area S12 in which the first and second scan areas S1 and S2 overlap each other.

Referring to FIG. 6A, if the line scan camera 220 scans the first scan area S1, an image of the shape of a part (for example, the middle part and top part) of the wafer die 61 may be obtained. If the line scan camera 220 scans the second scan area S2, an image of the shape of another part (for example, the middle part and bottom part) of the wafer die 61 may be obtained. Here, in the first overlapping area S12 in which the first and second scan areas S1 and S2 overlap each other, images of the shape of a predetermined part (for example, the middle part) of the wafer die 61 may appear overlapping. The whole shape of the wafer die 61 located in this first overlapping area S12 may be obtained by the following method.

Figure 6B:
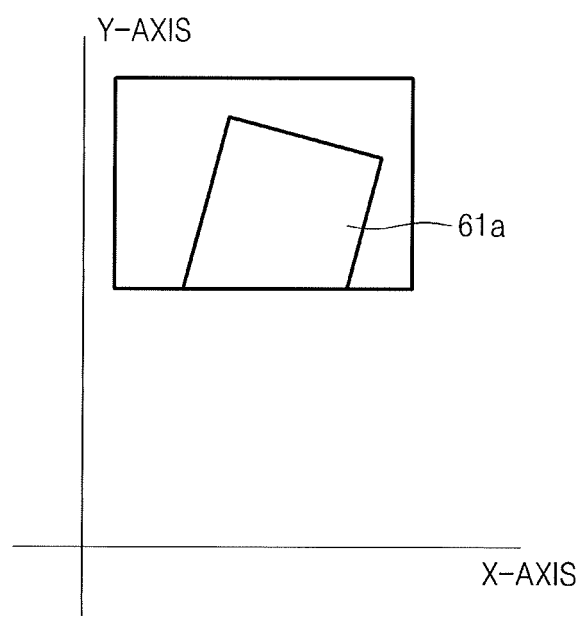
Figure 6C:
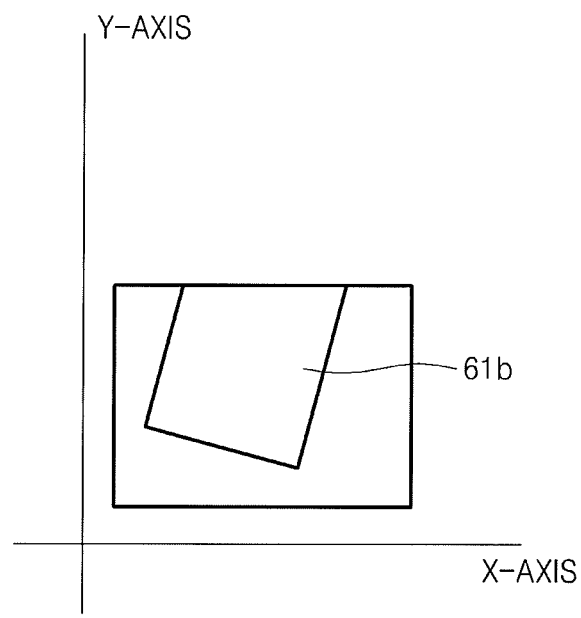
Figure 6D:
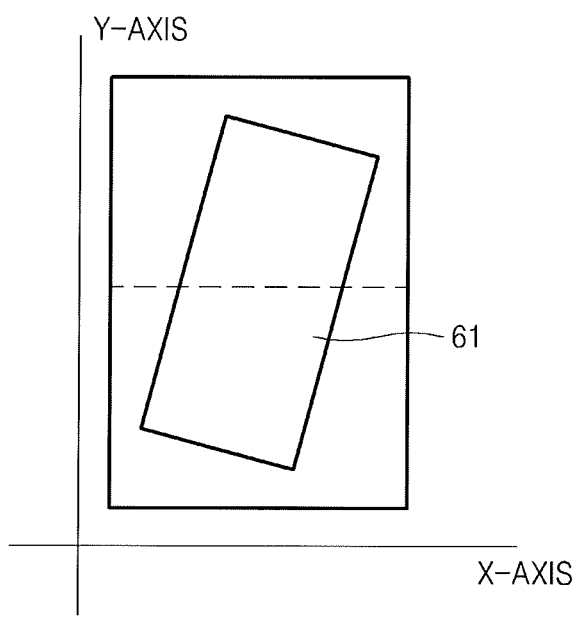

First, as shown in FIG. 6A, a reference line L which is a reference for image synthesis is set in order to obtain the whole shape of the wafer die 61 located in the first overlapping area S1. Next, as shown in FIG. 6B, a first image 61A based on the reference line L is extracted from an image of the shape of the part of the wafer die 61 obtained in the scanning of the first scan area S1. Then, as shown in FIG. 6C, a second image 61B based on the reference line L is extracted from an image of the shape of the part of the wafer die 61 obtained in the scanning of the second scan area S2. Finally, as shown in FIG. 6D, if the extracted first and second images 61A and 61B are synthesized, the whole shape of the wafer die 61 located in the first overlapping area S12 can be identified. Here, the shape of the wafer dies may be identified by expressing the outline of each of the wafer dies 61 through the images obtained by synthesizing the first and second images 61A and 61B.

After the shape of each of the wafer dies 61 located in the first overlapping area S12 is identified through this process, the position information of the wafer die 61 may be obtained by measuring the position of the reference point and tilt angle of the wafer die 61 in the X-Y coordinate system. The method of identifying the position information of the wafer die 61 is explained above in detail with reference to FIG. 5 and the explanation will be omitted here. Meanwhile, a case in which the scan process is performed three times is explained above, but the number of times of scanning may vary greatly according to the size of a wafer W or the scan field of the line scan camera 220.

As described above, the position information of the wafer dies 51 and 52 located in a non-overlapping area among the scan areas S1 through S3 may be obtained by the method shown in FIG. 5, and the shape and position information of the wafer dies 61 located in the overlapping areas S12 and S23 among the scan areas S1 through S3 may be obtained by using the method shown in FIGS. 6A through 6D and the method shown in FIG. 5. Accordingly, in the present embodiment, the shape and position information of all wafer dies divided on a wafer can be obtained through multiple scan processes using the line scan camera 220. According to the thus-obtained position information of all wafer dies, the laser marker 230 of FIG. 3 can perform accurate marking on a required location of each wafer die.

While one or more embodiments of the present invention have been described with reference to the figures, they should be considered in a descriptive sense only, and it will be understood by those of ordinary skill in the art that various changes in form and details may be made therein.

MODE OF THE INVENTION

According to an aspect of the present invention, provided is a marking method of a plurality of wafer dies which are divided by a wafer dicing process, with a laser marker, the method including: setting a plurality of scan areas on the wafer including the wafer dies in which some of the scan areas overlap each other; performing a plurality of scan processes for scanning the scan areas on the wafer by using a line scan camera; collecting position information of each wafer die located on areas where the scan areas do not overlap; collecting through image synthesis position information of each wafer die located on areas where the scan areas overlap; and with the laser marker performing marking of each of the wafer dies whose position information is collected.

The wafer dies may be arranged irregularly.

The method may further include making the coordinate system of the line scan camera coincide with the coordinate system of the laser marker.

The collecting of position information of each wafer die located on areas where the scan areas do not overlap may include: identifying the shape of each of the wafer dies; and collecting the position information of the wafer dies by using the identified shape information of the wafer dies.

The identifying of the shape of each wafer die may be pedalled by photographing the wafer dies with the line scan camera and expressing through the photographed image the outline of each of the wafer dies.

The collecting of the position information of each wafer die may be performed by measuring the position of a reference point and the tilt angle of each of the wafer dies.

The collecting of position information of each wafer die located on areas where the scan areas overlap may include: identifying the shape of each of the wafer dies; and collecting the position information of the wafer dies by using the identified shape information of the wafer dies.

The identifying of the shape of each of the wafer dies may include: extracting a first image from partial images of the wafer dies which are captured by scanning any one scan area of two scan areas which overlap each other partially; extracting a second image from partial images of the wafer dies which are captured by scanning the other scan area of the two scan areas which overlap each other partially; and identifying the shape of each of the wafer dies by synthesizing the first image and the second image.

The shape of each wafer die may be identified by expressing the outline of each of the wafer dies with the images in which the first and second images are synthesized.

The marking of each of the wafer dies may be performed by the laser marker performing marking of each of the wafer dies according to the position information of each of the wafer dies.

The invention claimed is:

1. A marking method of a plurality of wafer dies which are divided by a wafer dicing process, with a laser marker, the method comprising:
    setting a plurality of scan areas on the wafer including the wafer dies in which some of the scan areas overlap each other;
    performing a plurality of scan processes for scanning the scan areas on the wafer by using a line scan camera;
    collecting position information of each wafer die located on areas where the scan areas do not overlap;
    collecting through image synthesis position information of each wafer die located on areas where the scan areas overlap; and
    performing marking of each of the wafer dies whose position information is collected with the laser marker.

2. The method of claim 1, wherein the wafer dies are arranged irregularly.

3. The method of claim 1, further comprising making the coordinate system of the line scan camera coincide with the coordinate system of the laser marker.

4. The method of claim 1, wherein the collecting of position information of each wafer die located on areas where the scan areas do not overlap comprises:
identifying the shape of each of the wafer dies; and
collecting the position information of the wafer dies by using the identified shape information of the wafer dies.

5. The method of claim 4, wherein the identifying of the shape of each wafer die is performed by photographing the wafer dies with the line scan camera and expressing through the photographed image the outline of each of the wafer dies.

6. The method of claim 5, wherein the collecting of the position information of each wafer die is performed by measuring the position of a reference point and the tilt angle of each of the wafer dies.

7. The method of claim 1, wherein the collecting of position information of each wafer die located on areas where the scan areas overlap comprises:
identifying the shape of each of the wafer dies; and
collecting the position information of the wafer dies by using the identified shape information of the wafer dies.

8. The method of claim 7, wherein the identifying of the shape of each of the wafer dies comprises:
extracting a first image from partial images of the wafer dies which are captured by scanning any one scan area of two scan areas which overlap each other partially;
extracting a second image from partial images of the wafer dies which are captured by scanning the other scan area of the two scan areas which overlap each other partially; and
identifying the shape of each of the wafer dies by synthesizing the first image and the second image.

9. The method of claim 8 wherein the shape of each wafer die is identified by expressing the outline of each of the wafer dies with the images in which the first and second images are synthesized.

10. The method of claim 9, wherein the collecting of the position information of each wafer die is performed by measuring the position of a reference point and the tilt angle of each of the wafer dies.

11. The method of claim 1, wherein the marking of each of the wafer dies is performed by the laser marker performing marking of each of the wafer dies according to the position information of each of the wafer dies.

* * * * *